(12) United States Patent
Yamkovoy

(10) Patent No.: US 9,413,114 B2
(45) Date of Patent: Aug. 9, 2016

(54) THREE-LEVEL POWER CONVERTER

(71) Applicant: Semikron Elektronik GmbH & Co., KG, Nürnberg (DE)

(72) Inventor: Tatiana Yamkovoy, Acton, MA (US)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 0 days.

(21) Appl. No.: 14/300,722

(22) Filed: Jun. 10, 2014

(65) Prior Publication Data

US 2015/0126052 A1    May 7, 2015

Related U.S. Application Data

(60) Provisional application No. 61/833,359, filed on Jun. 10, 2013.

(51) Int. Cl.
*H01R 9/22* (2006.01)
*H01R 13/652* (2006.01)
*H05K 7/14* (2006.01)
*H05K 7/02* (2006.01)

(52) U.S. Cl.
CPC ............ *H01R 13/652* (2013.01); *H05K 7/1432* (2013.01); *H05K 7/023* (2013.01)

(58) Field of Classification Search
CPC ..................................................... H05K 7/023
USPC ...................................... 439/717, 928, 928.1
See application file for complete search history.

(56) References Cited

U.S. PATENT DOCUMENTS

| | | | | |
|---|---|---|---|---|
| 3,054,024 A | * | 9/1962 | Van Dillen et al. | 361/747 |
| 4,546,267 A | * | 10/1985 | Urfirer | 307/116 |
| 4,569,567 A | * | 2/1986 | Zucchini | 439/639 |
| 5,249,979 A | * | 10/1993 | Deinhardt et al. | 439/341 |
| 5,267,873 A | * | 12/1993 | Provenzale | 439/347 |
| 5,568,356 A | * | 10/1996 | Schwartz | 439/51 |
| 5,754,405 A | * | 5/1998 | Derouiche | 361/744 |
| 6,475,036 B2 | * | 11/2002 | Morikawa | 439/716 |
| 7,184,272 B1 | * | 2/2007 | Harlacher et al. | 361/729 |
| 7,667,952 B2 | | 2/2010 | Allain | |

FOREIGN PATENT DOCUMENTS

EP    1 815 486    8/2007

* cited by examiner

*Primary Examiner* — Tho D Ta
(74) *Attorney, Agent, or Firm* — The Law Offices of Roger S. Thompson

(57) ABSTRACT

A 3-level power converter device with power semiconductor components including a first direct voltage positive potential terminal, a first direct voltage negative potential terminal, and first and second neutral voltage potential terminals. The first and second neutral voltage potential terminals are electrically conductively connected. The first direct voltage positive potential terminal and the first neutral voltage potential terminal form a first terminal pair, and the second neutral voltage potential terminal and the first direct voltage negative potential terminal form a second terminal pair. The first and second terminal pairs are arranged one behind another in a second direction. The first direct voltage positive potential terminal and the first neutral voltage potential terminal are arranged one above another in a third direction, and the second neutral voltage potential terminal and the first direct voltage negative potential terminal are arranged one above another in the third direction.

4 Claims, 6 Drawing Sheets

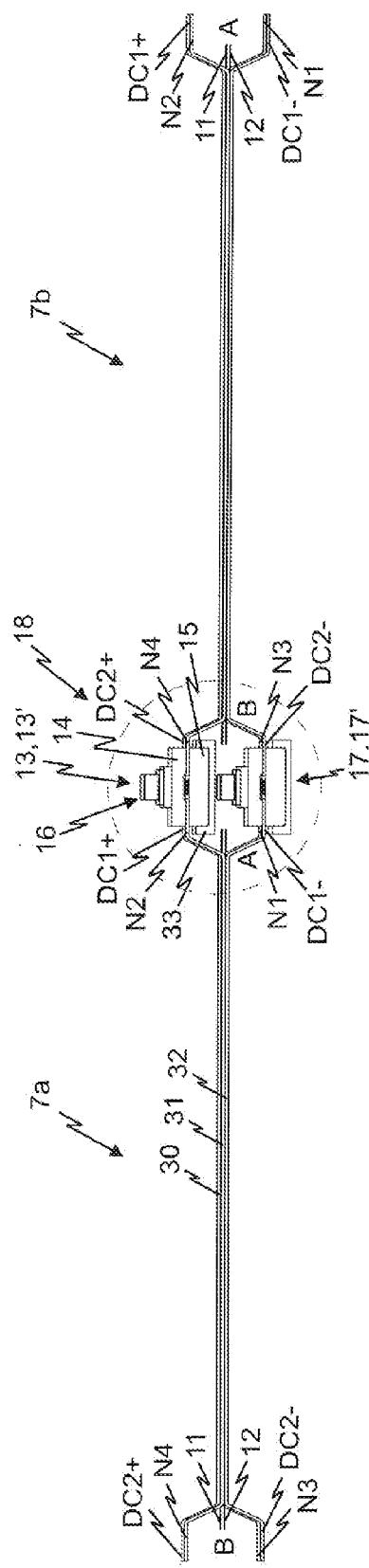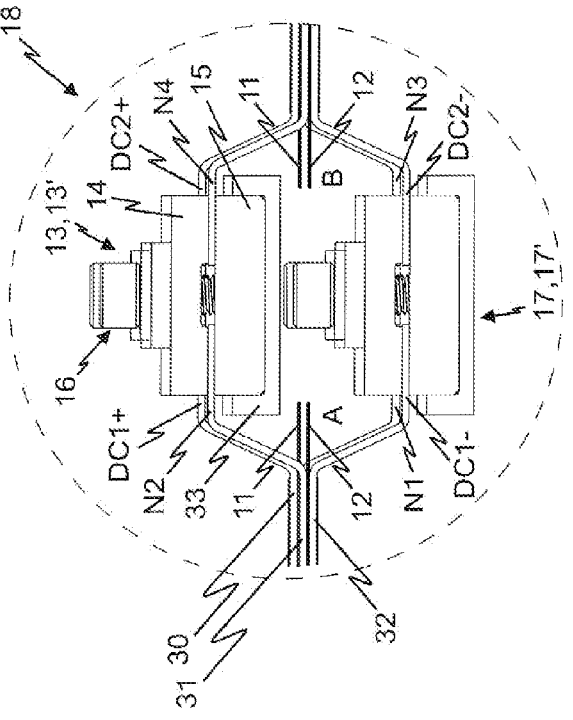

THREE-LEVEL POWER CONVERTER

CROSS-REFERENCE TO RELATED APPLICATION

This application is a non-provisional application which claims domestic priority from prior-filed provisional application Ser. No. 61/833,359, filed Jun. 10, 2013.

BACKGROUND OF THE INVENTION

1. Field of the Invention

The invention relates to a 3-level power converter.

2. Description of the Related Art

A 3-level power converter can be distinguished from the widely used conventional power converters by the fact that, when it is operated as an alternating current converter, on its load terminal AC on the alternating voltage side it can not only generate an electrical alternating voltage in the same way as a conventional power converter, the value of which essentially corresponds to the electrical positive or negative electrical voltage of the intermediate circuit voltage Ud, but in addition can generate an electrical voltage on the load terminal AC on the alternating voltage side, the value of which corresponds essentially to half the electrical positive or negative voltage of the intermediate circuit voltage Ud.

By this means, e.g., the voltage generated at the load terminal AC on the alternating voltage side can be a better approximation to a sinusoidal alternating voltage.

Here a 3-level power converter as a rule has a plurality of 3-level power converter devices, which are electrically connected with one another so as to implement a 3-level power converter.

The configuration of the electrical terminals of technically conventional 3-level power converter devices, by means of which technically conventional 3-level power converter devices are electrically connected with one another so as to implement a 3-level power converter, has the disadvantage that during commutation processes the latter has a relatively high effective parasitic inductance, which in the case of commutation processes has as a consequence high switching surges that reduce the switching speed and switching frequency that can be implemented on the power semiconductor switches of the 3-level power converter devices.

From EP 1 815 486 B1 a connection system between capacitor banks, which are connected with a power circuit, is of known art.

SUMMARY OF THE INVENTION

The object of the invention is to provide an improved 3-level power converter device, which can be connected with a further 3-level power converter device in an electrically conducting manner with low inductance.

This object is achieved by means of a 3-level power converter device with power semiconductor components, wherein the 3-level power converter device for purposes of making electrical contact has a first direct voltage positive potential terminal, a first direct voltage negative potential terminal, and a first and a second neutral voltage potential terminal, which in each case have a flat form, are arranged on a first face of the 3-level power converter device and protrude in a positive direction from the 3-level power converter device in a first direction, wherein the first direct voltage positive potential terminal and the first neutral voltage potential terminal form a first terminal pair, and the second neutral voltage potential terminal and the first direct voltage negative potential terminal form a second terminal pair, wherein the first and the second terminal pairs are arranged in a second direction one behind another, wherein the first direct voltage positive potential terminal and the first neutral voltage potential terminal are arranged in a third direction one above another, and the second neutral voltage potential terminal and the first direct voltage negative potential terminal are arranged in the third direction one above another.

It proves to be advantageous if the first direct voltage positive potential terminal and the first direct voltage negative potential terminal and the first and the second neutral voltage potential terminals run parallel to a plane defined by the first and second directions. By this means a particularly simple connection of the potential terminals with the potential terminals of a further inventive 3-level power converter device is enabled.

Furthermore it proves to be advantageous if the second neutral voltage potential terminal and the first direct voltage positive potential terminal are arranged in the second direction one behind another, and the first direct voltage negative potential terminal and the first neutral voltage potential terminal are arranged in the second direction one behind another. By this means a particularly simple connection of the 3-level power converter device with a further inventive 3-level power converter device is enabled.

Furthermore it proves to be advantageous if the 3-level power converter device for purposes of making electrical contact has a second direct voltage positive potential terminal, a second direct voltage negative potential terminal and a third and a fourth neutral voltage potential terminal, which in each case have a flat form, are arranged on a second face of the 3-level power converter device opposite the first face and protrude in the negative direction from the 3-level power converter device in the first direction, wherein the first, second, third and the fourth neutral voltage potential terminals are electrically conductively connected with one another, and the first and the second direct voltage positive potential terminals are electrically conductively connected with one another, and the first and the second direct voltage negative potential terminals are electrically conductively connected with one another, wherein the second direct voltage positive potential terminal and the third neutral voltage potential terminal form a third terminal pair, and the fourth neutral voltage potential terminal and the second direct voltage negative potential terminal form a fourth terminal pair, wherein the third and the fourth terminal pairs are arranged in the second direction one behind another, wherein the second direct voltage positive potential terminals and the third neutral voltage potential terminal are arranged in the third direction one above another, and the fourth neutral voltage potential terminal and the second direct voltage negative potential terminal are arranged in the third direction one above another. By this means a 3-level power converter device is created that can be electrically connected together in series with other 3-level power converter devices.

Furthermore it proves to be advantageous if the second direct voltage positive potential terminal and the second direct voltage negative potential terminal and the third and the fourth neutral voltage potential terminals run parallel to a plane defined by the first and second directions. By this means a particularly simple connection of the potential terminals with the potential terminals of a further inventive 3-level power converter device is enabled.

Furthermore it proves to be advantageous if the second direct voltage negative potential terminal and the third neutral voltage potential terminal are arranged in the second direction one behind another, and the fourth neutral voltage potential terminal and the second direct voltage positive potential terminal are arranged in the second direction one behind another. By this means a particularly simple connection of the 3-level power converter device with a further inventive 3-level power converter device is enabled.

Furthermore a 3-level power converter system proves to be advantageous, wherein the 3-level power converter system has a first and a second inventively designed 3-level power converter device, wherein:

the first direct voltage positive potential terminal of the first 3-level power converter device is connected with the second direct voltage positive potential terminal of the second 3-level power converter device, and the first direct voltage negative potential terminal of the first 3-level power converter device is connected with the second direct voltage negative potential terminal of the second 3-level power converter device, and the first neutral voltage potential terminal of the first 3-level power converter device is connected with the third neutral voltage potential terminal of the second 3-level power converter device, and the second neutral voltage potential terminal of the first 3-level power converter device is connected with the fourth neutral voltage potential terminal of the second 3-level power converter device.

The first and second inventive 3-level power converter devices are thus electrically conductively connected with one another with low inductance.

Furthermore it proves to be advantageous if:

the first direct voltage positive potential terminal of the first 3-level power converter device is connected with the second direct voltage positive potential terminal of the second 3-level power converter device, and the first direct voltage negative potential terminal of the first 3-level power converter device is connected with the second direct voltage negative potential terminal of the second 3-level power converter device, and the first neutral voltage potential terminal of the first 3-level power converter device is connected with the third neutral voltage potential terminal of the second 3-level power converter device, and the second neutral voltage potential terminal of the first 3-level power converter device is connected with the fourth neutral voltage potential terminal of the second 3-level power converter device; in each case these connections are via an electrically conductive clamp.

By this means a simple connection of the 3-level power converter device with a further inventive 3-level power converter device is enabled.

Furthermore it proves to be advantageous if the clamp has a first electrically conducting clamp element and a second magnetically non-conducting clamp element, between which the respective potential terminals are arranged, connected with one another via the respective clamp. By this means eddy currents occurring on the clamps are reduced.

Furthermore it proves to be advantageous if:

the first direct voltage positive potential terminal of the first 3-level power converter device has an electrically conducting contact with the second direct voltage positive potential terminal of the second 3-level power converter device, and the first direct voltage negative potential terminal of the first 3-level power converter device has an electrically conducting contact with the second direct voltage negative potential terminal of the second 3-level power converter device, and the first neutral voltage potential terminal of the first 3-level power converter device has an electrically conducting contact with the third neutral voltage potential terminal of the second 3-level power converter device, and the second neutral voltage potential terminal of the first 3-level power converter device has an electrically conducting contact with the fourth neutral voltage potential terminal of the second 3-level power converter device; in each case these contacts are made via a screw connection.

By this means a simple connection of the 3-level power converter device with a further inventive 3-level power converter device is enabled.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings:

FIG. 6 shows a side view of first and second electrically conducting connection device, in accordance with the invention;

FIG. 7 shows a detail from FIG. 6; and

DETAILED DESCRIPTION OF THE PRESENTLY PREFERRED EMBODIMENTS

Figure 1:
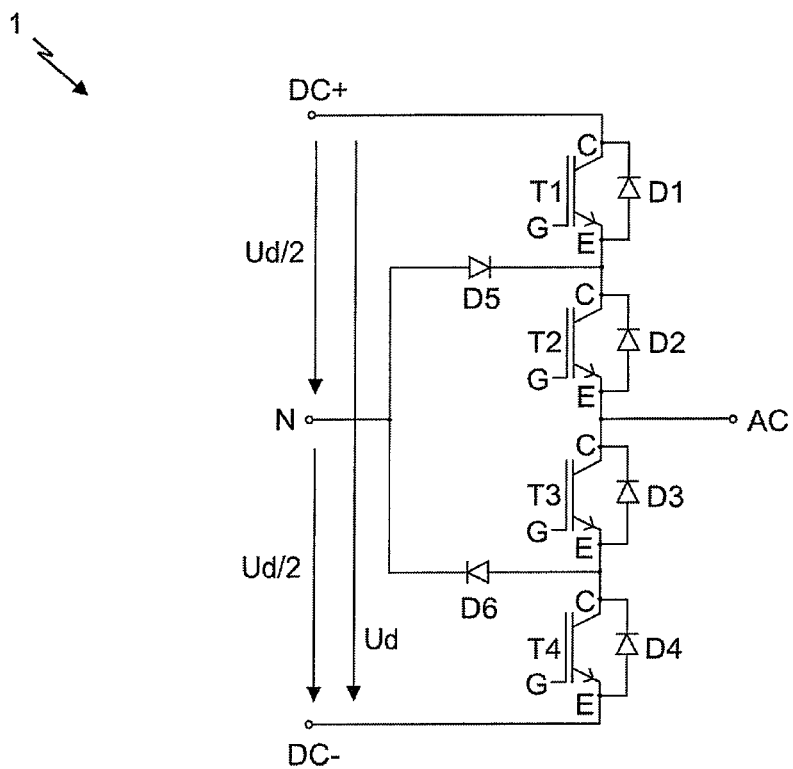
FIG. 1 shows an electrical circuit diagram of a conventional 3-level half-bridge power converter in accordance with the prior art.

FIG. 1 shows an example of an electrical circuit diagram of a prior art 3-level half-bridge power converter 1. Three-level half-bridge power converter 1 has a first power semiconductor switch T1, a second power semiconductor switch T2, a third power semiconductor switch T3, a fourth power semiconductor switch T4, a first diode D1, a second diode D2, a third diode D3, a fourth diode D4, a fifth diode D5, and a sixth diode D6. These components are electrically connected, as represented in FIG. 1, so as to form 3-level half-bridge power converter 1. Three-level half-bridge power converter 1 is fed from two voltage sources that are not represented in FIG. 1; each generates half the intermediate circuit voltage Ud/2, so that the intermediate circuit voltage Ud is applied between the direct voltage positive potential terminal DC+ and the direct voltage negative potential terminal DC−, and the direct voltage positive potential terminal DC+ has the positive intermediate circuit half-voltage Ud/2 with respect to the neutral voltage potential terminal N, and the direct voltage negative potential terminal DC− has the negative intermediate circuit half-voltage Ud/2 with respect to the neutral voltage potential terminal N. Three-level half-bridge power converter 1 is designed as a so-called NPC (neutral point clamped) 3-level half-bridge power converter. Fifth diode D5 and sixth diode D6 can be electrically connected in antiparallel with each power semiconductor switch at a time; this is not represented in FIG. 1. Such a 3-level half-bridge power converter represents a particular form of an NPC 3-level half-bridge power converter, and in specialist terms is also designated as a so-called ANPC (active neutral point clamped) 3-level half-bridge power converter.

In FIG. 1, the power semiconductor switches are designed as IGBTs, and can be switched in and out via their control inputs G. The collectors of the power semiconductor switches are given the reference symbol C and the emitters of the power semiconductor switches are given the reference symbol E. By means of appropriate switching in and out of the power semiconductor switches the load terminal AC on the alternating voltage side can, with respect to a load terminal AC on the alternating voltage side of a further technically conventional 3-level half-bridge power converter, not shown in FIG. 1, which is constructed in an analogous manner to the 3-level half-bridge power converter represented in FIG. 1, wherein an electrical load (e.g., a motor) is arranged between the two load terminals AC on the alternating voltage sides of the two 3-level half-bridge power converters, electrical voltages are generated, the values of which essentially correspond to the positive or negative electrical voltage of the intermediate circuit voltage Ud or essentially to the positive or negative electrical intermediate circuit half-voltages Ud/2, so that with appropriate control of the power semiconductor switches a corresponding alternating voltage applied across the load at load terminal AC on the alternating voltage side can be generated from the positive and negative intermediate circuit voltage Ud, that is to say from the positive and negative intermediate half-voltages Ud/2. The electrical functionality of a 3-level power converter is in general terms of known prior art.

Figure 2:
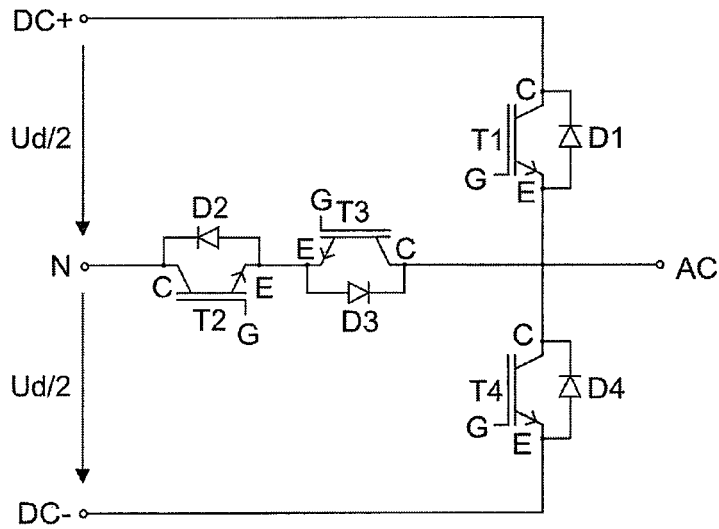
FIG. 2 shows an electrical circuit diagram of a further conventional 3-level half-bridge power converter in accordance with the prior art.

FIG. 2 represents an example of an electrical circuit diagram of a further 3-level half-bridge power converter 1' in accordance with the prior art. Three-level half-bridge power converter 1' in FIG. 2 corresponds in terms of functionality and the power semiconductor components to 3-level half-bridge power converter 1 in FIG. 1, but in contrast to 3-level half-bridge power converter 1 in FIG. 1, has a so-called T-circuit topology. Three-level half-bridge power converter 1' in FIG. 2 is likewise designed as a so-called NPC 3-level half-bridge power converter.

Here, for purposes of increasing the electrical power output, i.e., the current carrying capacity, of the 3-level half-bridge power converter, further power semiconductor components of the same type can in each case be electrically connected in parallel with the original power semiconductor components.

In addition to the two electrical circuits of 3-level half-bridge power converters represented as examples in FIGS. 1 and 2, there exist still further technically conventional electrical circuits of 3-level half-bridge power converters.

It should be noted that a 3-level power converter has at least two 3-level half-bridge power converters. Thus, a 3-level power converter can have, e.g., three 3-level half-bridge power converters, by means of which, by appropriate control of the power semiconductor switches of the 3-level half-bridge power converters, a 3-phase alternating voltage can be generated, e.g., for purposes of controlling a 3-phase electric motor. Needless to say, a 3-level power converter can also operate as a rectifier.

Figure 3:
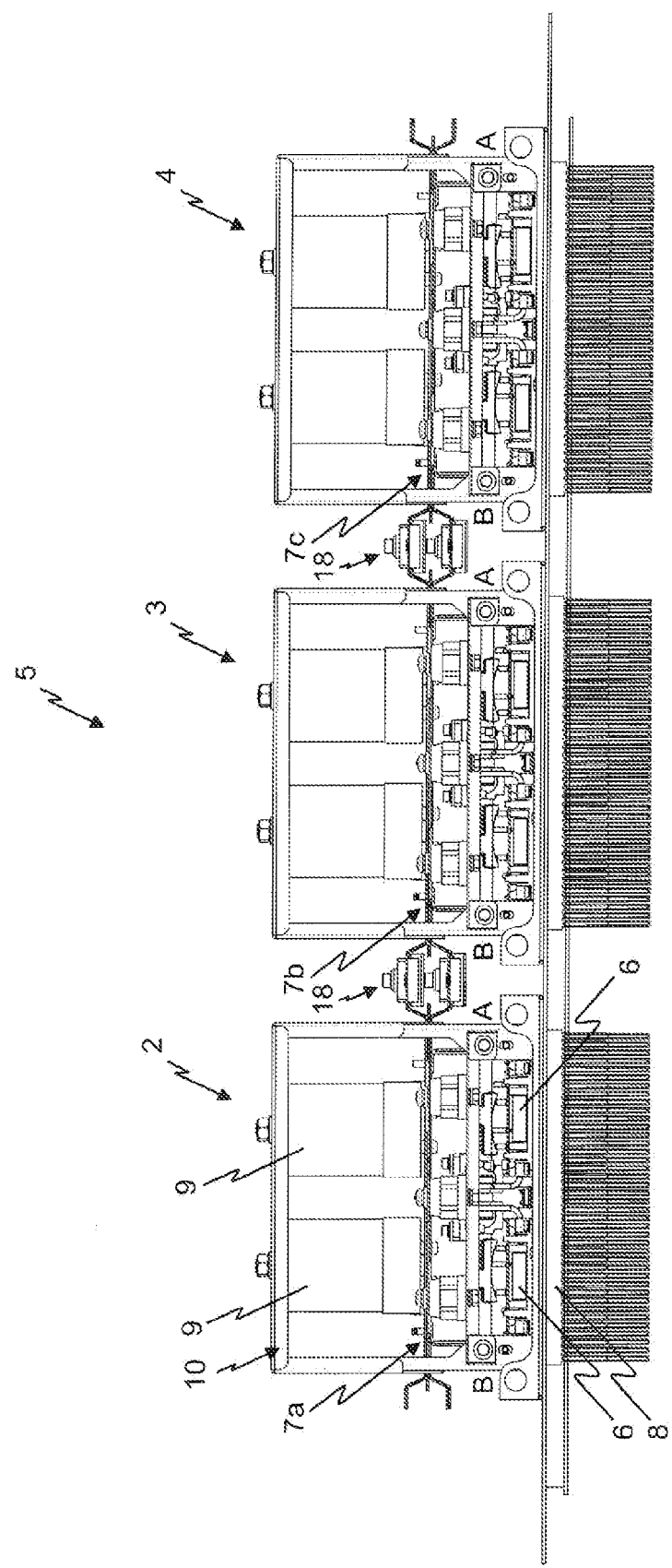
FIG. 3 shows a side view of a 3-level power converter system with three 3-level power converter devices, in accordance with the invention.
Figure 4:
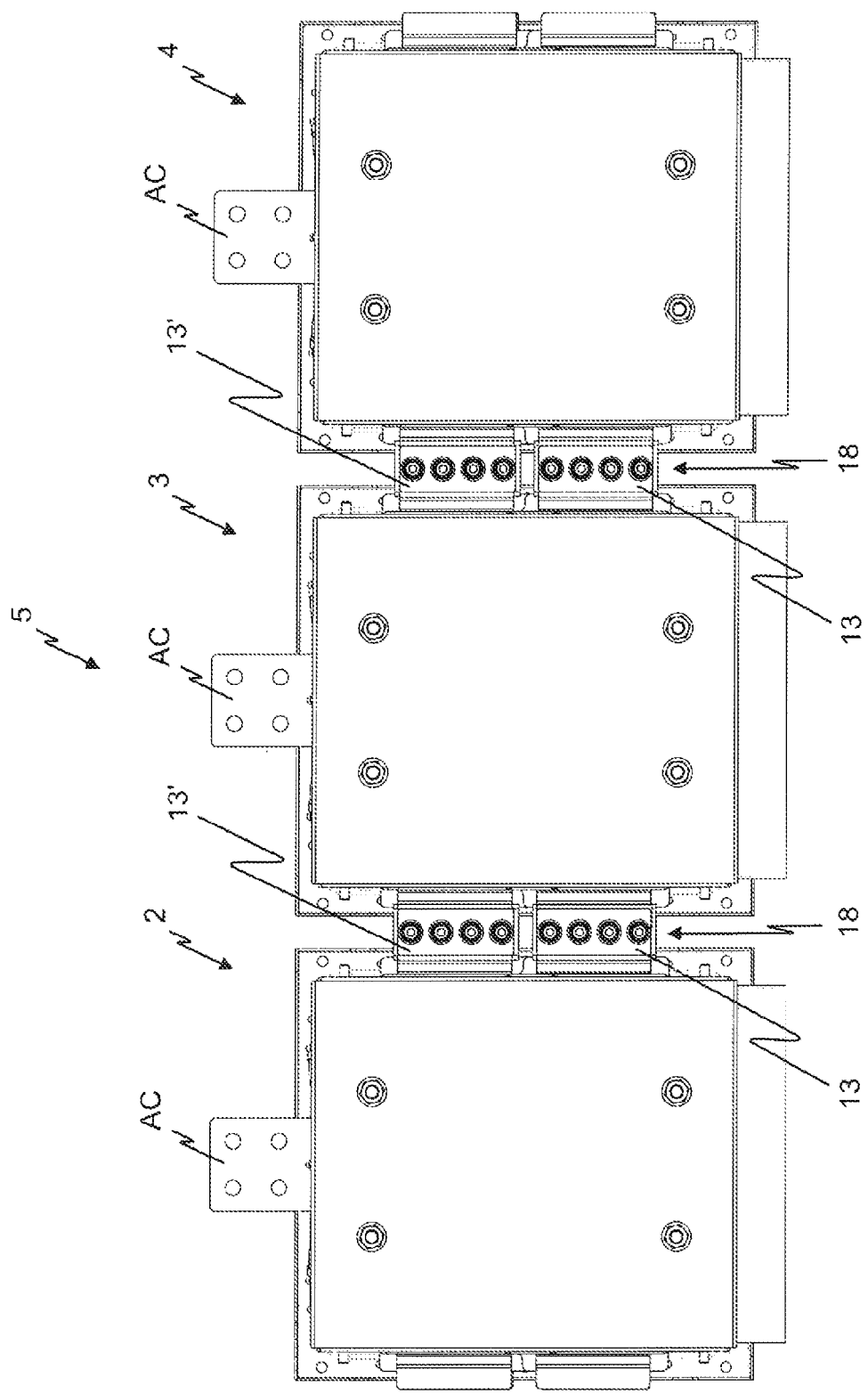
FIG. 4 shows top view of a 3-level power converter system with three inventive 3-level power converter devices, in accordance with the invention.

FIG. 3 illustrates a side view a 3-level power converter system 5 in accordance with the invention, which has an inventive first 3-level power converter device 2, an inventive second 3-level power converter device 3, and an inventive third 3-level power converter device 4. FIG. 4 represents 3-level power converter system 5 in a top view. Here first, second and third 3-level power converter devices 2, 3 and 4 are of identical design, so that in the interests of clarity it is primarily only the elements of the first 3-level power converter device 2 that are given reference symbols, and the following description is primarily related to the first 3-level power converter device 2, although it also applies in an identical manner to the second and third 3-level power converter devices 3 and 4.

First 3-level power converter device 2 has power semiconductor components 6, which are designed in each case as power semiconductor switches or diodes. Power semiconductor components 6 are electrically connected so as to form a 3-level half-bridge power converter, which can, e.g., be designed in accordance with the 3-level half-bridge power converter 1 or 1' represented in FIG. 1 or FIG. 2, respectively. Power semiconductor components 6 are preferably arranged on a substrate, which can exist in the form, e.g., of a DCB (direct copper bonded) substrate, or an insulated metal substrate. Furthermore first 3-level power converter device 2 has a cooling body 8 for cooling power semiconductor components 6; cooling body 8 is coupled to power semiconductor components 6 in a thermally conducting manner. Furthermore first 3-level power converter device 2 preferably has a housing 10, which covers the power semiconductor components 6.

First 3-level power converter device 2 has an electrically conducting first connection device 7a, second 3-level power converter device 3 has an electrically conducting second connection device 7b, and third 3-level power converter device 4 has an electrically conducting third connection device 7c. First, second and third connection devices 7a, 7b and 7c are preferably substantially identical. First and second connection devices 7a and 7b are illustrated in detail in FIGS. 5 to 7, wherein in FIG. 5 first and second electrically conducting connection devices 7a and 7b are represented in a perspective view, and in FIG. 6 in a side view. FIG. 7 is a detail from FIG. 6.

Figure 5:
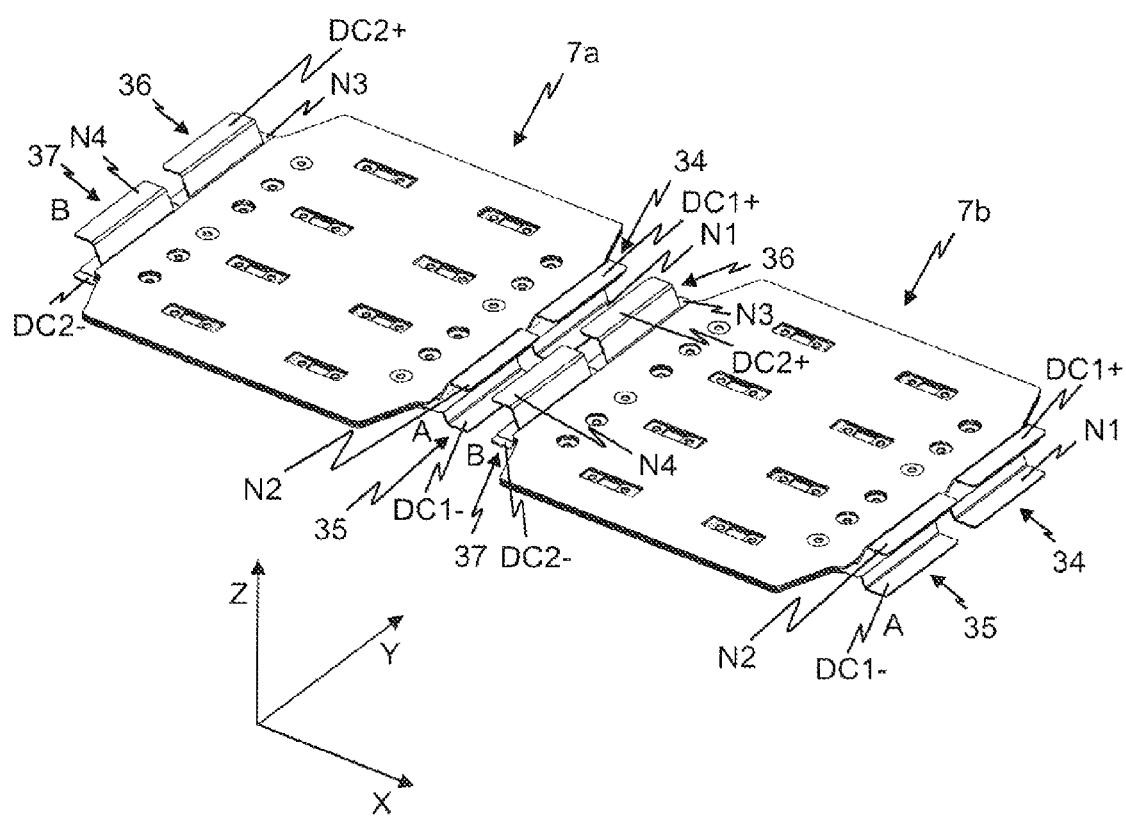
FIG. 5 shows a perspective view of first and second electrically conducting connection devices, in accordance with the invention.

To make electrical contact between first 3-level power converter device 2 and an external device, first 3-level power converter device 2 has a first direct voltage positive potential terminal DC1+, a first direct voltage negative potential terminal DC1−, and first and second neutral voltage potential terminals N1 and N2, respectively. Power semiconductor components 6 are electrically connected with first direct voltage positive potential terminal DC1+, first direct voltage negative potential terminal DC1−, and first and second neutral voltage potential terminals N1 and N2 to form at least one 3-level half-bridge power converter. Here, the external device can exist, e.g., in the form of a further 3-level power converter device. First direct voltage positive potential terminal DC1+, first direct voltage negative potential terminal DC1−, and first and second neutral voltage potential terminals N1, N2, are preferably generally flat, and are arranged on a first face A of first 3-level power converter device 2 and protrude from 3-level power converter device 2 generally in a first direction X (FIG. 5). Likewise, alternating voltage terminal AC preferably has a generally flat form and preferably protrudes from 3-level power converter device 3 generally in a second direction Y (best seen in FIG. 4). First and second neutral voltage potential terminals N1 and N2 are electrically conductively connected with one another. First direct voltage positive potential terminal DC1+ and first neutral voltage potential terminal N1 together form a first terminal pair 34, and the second neutral voltage potential terminal N2 and the first direct voltage negative potential terminal DC1− form a second terminal pair 35, wherein first and second terminal pairs 34 and 35 are arranged one behind another in the second direction Y, wherein first direct voltage positive potential terminal DC1+ and first neutral voltage potential terminal N1 are arranged one above another in a third direction Z, and second neutral voltage potential terminal N2 and first direct voltage negative potential terminal DC1− are arranged one above another in the third direction Z. First, second and third directions X, Y and Z are generally orthogonal with respect to one another.

First direct voltage positive potential terminal DC1+ represents the physical design of the direct voltage positive potential terminal DC+ represented in the electrical circuit diagrams in FIGS. 1 and 2. First direct voltage negative potential terminal DC1− represents the physical design of the direct voltage negative potential terminal DC− represented in the electrical circuit diagrams in FIGS. 1 and 2. First neutral voltage potential terminal N1 and second neutral voltage potential terminal N2 represent the physical design of neutral voltage potential terminal N represented in the electrical circuit diagrams in FIGS. 1 and 2, i.e., neutral voltage potential terminal N is inventively designed physically in the form of the two neutral voltage potential terminals N1 and N2 that are electrically conductively connected with one another.

Alternating voltage potential terminal AC represents the physical design of load terminal AC on the alternating voltage side represented in the electrical circuit diagrams in FIGS. 1 and 2.

In the general operation of a three-level half-bridge power converter, the commutation circuits of the electrical currents that are formed with the switching in and out of power semiconductor switches 6 are arranged between direct voltage positive potential terminal DC+ and neutral voltage potential terminal N, and between direct voltage negative potential terminal DC− and the neutral voltage potential terminal N. This technical knowledge is used to implement inventive 3-level power converter device 2, which can be electrically conductively connected with low inductance with a further 3-level power converter device, in that neutral voltage potential terminal N represented in the electrical circuit diagrams in FIGS. 1 and 2 is implemented physically in the form of the first and the second neutral voltage potential terminals N1 and N2 that are electrically conductively connected with one another, and first neutral voltage potential terminal N1 is assigned to first direct voltage positive potential terminal DC1+, and second neutral voltage potential terminal N2 is assigned to first direct voltage negative potential terminal DC1−. Each of the direct voltage potential terminals thus has a neutral voltage potential terminal assigned to the respective direct voltage potential terminal.

In the context of the example of the preferred embodiment, first direct voltage positive potential terminal DC1+ and first direct voltage negative potential terminal DC1−, and first and second neutral voltage potential terminals N1, N2 run parallel to a plane defined by the first and second directions X and Y.

Second neutral voltage potential terminal N2 and first direct voltage positive potential terminal DC1+ are preferably arranged one behind another in second direction Y, and first direct voltage negative potential terminal DC1− and first neutral voltage potential terminal N1 are preferably arranged one behind another in second direction Y. Second neutral voltage potential terminal N2 is thus preferably arranged relative to first neutral voltage potential terminal N1 rotated through approximately 180° with respect to first direction X (axis of rotation) and displaced in the direction of second direction Y.

In the example of the preferred embodiment, inventive 3-level power converter device 2 for purposes of electrical contact has a second direct voltage positive potential terminal DC2+, a second direct voltage negative potential terminal DC2−, and third and fourth neutral voltage potential terminals N3 and N4, which in each case are flat, are arranged on a second face B of 3-level power converter device 2 opposite first face A and intrude into, i.e., protrude in a negative direction from the surface of, 3-level power converter device 2 in first direction X. First, second, third and fourth neutral voltage potential terminals N1, N2, N3 and N4, respectively, are electrically conductively connected with one another. Furthermore, first and second direct voltage positive potential terminals DC1+ and DC2+ are electrically conductively connected with one another, and first and second direct voltage negative potential terminals DC1− and DC2− are electrically conductively connected with one another. Second direct voltage positive potential terminal DC2+ and third neutral voltage potential terminal N3 together form a third terminal pair 36, and fourth neutral voltage potential terminal N4 and second direct voltage negative potential terminal DC2− together form a fourth terminal pair 37, wherein third and fourth terminal pairs 36 and 37 are arranged one behind another in second direction Y, wherein second direct voltage positive potential terminal DC2+ and third neutral voltage potential terminal N3 are arranged one above another in third direction Z, and fourth neutral voltage potential terminal N4 and second direct voltage negative potential terminal DC2− are arranged one above another in third direction Z.

First and second direct voltage positive potential terminals DC1+ and DC2+ represent the physical design of the direct voltage positive potential terminal DC+ represented in the electrical circuit diagrams in FIGS. 1 and 2. First and second direct voltage negative potential terminals DC1− and DC2− represent the physical design of direct voltage negative potential terminal DC− represented in the electrical circuit diagrams in FIGS. 1 and 2. First neutral voltage potential terminal N1 and second neutral voltage potential terminal N2 and third neutral voltage potential terminal N3 and fourth neutral voltage potential terminal N4 represent the physical design of the neutral voltage potential terminal N represented in the electrical circuit diagrams in FIGS. 1 and 2, i.e., neutral voltage potential terminal N is physically designed in the form of the four neutral voltage potential terminals N1, N2, N3 and N4 that are electrically conductively connected with one another. Thus, a three-level power converter device is created that can be electrically connected together in series with other three-level power converter devices.

In the context of the example of the preferred embodiment, second direct voltage positive potential terminal DC2+ and second direct voltage negative potential terminal DC2−, and third and fourth neutral voltage potential terminals N3 and N4 run parallel to a plane defined by the first and second directions X and Y.

Second direct voltage negative potential terminal DC2− and third neutral voltage potential terminal N3 are preferably arranged one behind another in second direction Y, and fourth neutral voltage potential terminal N4 and second direct voltage positive potential terminal DC2+ are preferably arranged one behind another in second direction Y. Third neutral voltage potential terminal N3 is thus preferably arranged relative to fourth neutral voltage potential terminal N4 rotated through 180° with respect to first direction X (axis of rotation) and displaced in the direction of second direction Y.

Second direct voltage positive potential terminal DC2+ is preferably arranged in relation to a plane defined by second and third directions Y and Z as a mirror image to first direct voltage positive potential terminal DC1+, wherein the dimensions of first and second direct voltage positive potential terminals DC1+ and DC2+ can differ from one another.

Second direct voltage negative potential terminal DC2− is preferably arranged in relation to a plane defined by second and third directions Y and Z as a mirror image to first direct voltage negative potential terminal DC1−, wherein the dimensions of first and second direct voltage positive potential terminals DC1− and DC2− can differ from one another.

Third neutral voltage potential terminal N3 is preferably arranged in relation to a plane defined by the second and third directions Y and Z as a mirror image to first neutral voltage potential terminal N1, wherein the dimensions of first and third neutral voltage potential terminals N1 and N3 can differ from one another.

Fourth neutral voltage potential terminal N4 is preferably arranged in relation to a plane defined by second and third directions Y and Z as a mirror image to second neutral voltage potential terminal N2, wherein the dimensions of second and fourth neutral voltage potential terminals N2 and N4 can differ from one another.

In the context of the example of a preferred embodiment, first and second direct voltage positive potential terminals DC1+ and DC2+ are present on end sections of a first multiply-angled electrically conducting metal plate element 30 running in the direction of first direction X, and first, second, third and fourth neutral voltage potential terminals N1, N2, N3 and N4 are present on end sections of a second multiply-angled electrically conducting metal plate element 31 running in the direction of first direction X, and first and second direct voltage negative potential terminals DC1− and DC2− are present on end sections of a third multiply-angled electrically conducting metal plate element 32 running in the direction of first direction X. First, second and third metal plate elements 30, 31 and 32 can consist, e.g., of copper, which can be provided with, e.g., one or a plurality of metallic surface coatings. An electrically non-conducting first layer 11 (e.g., a plastic film) is arranged between respective central sections of the first and second metal plate elements 30 and 31, which layer 11 electrically insulates the first and second metal plate elements 30 and 31 from one another. An electrically non-conducting second layer 12 (e.g., a plastic film) is arranged between respective central sections of second and third metal plate elements 31 and 32. Layer 12 electrically insulates second and third metal plate elements 31 and 32 from one another. First, second and third metal plate elements 30, 31 and 32 form, together with electrically non-conducting first and second layers 11 and 12, first electrically conducting connection device 7a. By virtue of the closely spaced arrangement of first, second and third metal plate elements 30, 31 and 32, connection device 7a has only a very low inductance. Second and third connection devices 7b and 7c are of identical design to first connection device 7a.

Furthermore, first 3-level power converter device 2 preferably has intermediate circuit capacitances 9, wherein in each case a respective intermediate circuit capacitance of the intermediate circuit capacitances 9 is electrically conductively connected with two of the three metal plate elements.

As represented in FIGS. 3, 4, 6 and 7, by means of first and second direct voltage positive potential terminals DC1+ and DC2+ and first and second direct voltage negative potential terminals DC1− and DC2− and first, second, third and fourth neutral voltage potential terminals N1, N2, N3 and N4 a plurality of inventive 3-level power converter devices can be electrically conductively connected with one another to form a 3-level power converter system. In such a manner, first 3-level power converter device 2, second 3-level power converter device 3, and third 3-level power converter device 4 in the preferred embodiment are electrically conductively connected with one another to form inventive 3-level power converter system 5. The respective connections between the 3-level power converter devices are given the reference symbol 18 in the Figures. Needless to say, it should be noted that more 3-level power converter devices than three 3-level power converter devices 2, 3, and 4 present in the described embodiment can be electrically conductively connected with one another to form a 3-level power converter system 5 in an identical manner.

As represented in FIGS. 4, 6 and 7, for purposes of electrical connection of first 3-level power converter device 2 with the second 3-level power converter device 3, first direct voltage positive potential terminal DC1+ of first 3-level power converter device 2 is electrically conductively connected with the second direct voltage positive potential terminal DC2+ of second 3-level power converter device 3, and first direct voltage negative potential terminal DC1− of first 3-level power converter device 2 is electrically conductively connected with second direct voltage negative potential terminal DC2− of second 3-level power converter device 3, and first neutral voltage potential terminal N1 of first 3-level power converter device 2 is electrically conductively connected with third neutral voltage potential terminal N3 of second 3-level power converter device 3, and second neutral voltage potential terminal N2 of first 3-level power converter device 2 is electrically conductively connected with fourth neutral voltage potential terminal N4 of second 3-level power converter device 3. Third 3-level power converter device 4 is connected with second 3-level power converter device 3 in a similar manner.

In the context of the example of the embodiment illustrated in FIGS. 3, 4, 6 and 7, first direct voltage positive potential terminal DC1+ of first 3-level power converter device 2 is connected with second direct voltage positive potential terminal DC2+ of second 3-level power converter device 3, and first direct voltage negative potential terminal DC1− of first 3-level power converter device 2 is connected with the second direct voltage negative potential terminal DC2− of the second 3-level power converter device 3, and first neutral voltage potential terminal N1 of first 3-level power converter device 2 is connected with third neutral voltage potential terminal N3 of second 3-level power converter device 3, and second neutral voltage potential terminal N2 of first 3-level power converter device 2 is connected with fourth neutral voltage potential terminal N4 of the second 3-level power converter device 3; in each case these connections are via an electrically conductive clamp, 13, 13', 17 and 17', respectively. Third 3-level power converter device 4 is connected with second 3-level power converter device 3 in a similar manner.

Each of electrically conductive clamps, 13, 13', 17, and 17' preferably has a first electrically conducting clamp element 14 (e.g., of copper, wherein the copper can be provided with a surface coating) and a second magnetically non-conducting clamp element 15 (e.g., of stainless steel), between which the respective potential terminals are arranged, connected with one another via the respective clamp (13, 13', 17, 17'). Here, first and second clamp elements 14 and 15 are pressed against one another by means of a screw connection 16, which connects first and the second clamp elements 14 and 15 with one another, wherein the two respective potential terminals to be connected are arranged between first and second clamp elements 14 and 15. Since clamp element 15 consists of a magnetically non-conducting material, the eddy currents occurring on clamp element 15 are reduced. Clamp elements 15 have on their lower faces an electrically non-conducting insulation body 33 (e.g., of plastic), which electrically insulates clamps 17 and 17' from clamps 13 and 13' that are arranged above them.

As an alternative to the clamp represented in the Figures and described above, the bipolar clamp disclosed in EP 1 815 486 B1, with which by means of a single clamp in each case two connections having different electrical potential can be manufactured, can also be used as a clamp, and thus the number of clamps required can be reduced by a half.

Figure 8:
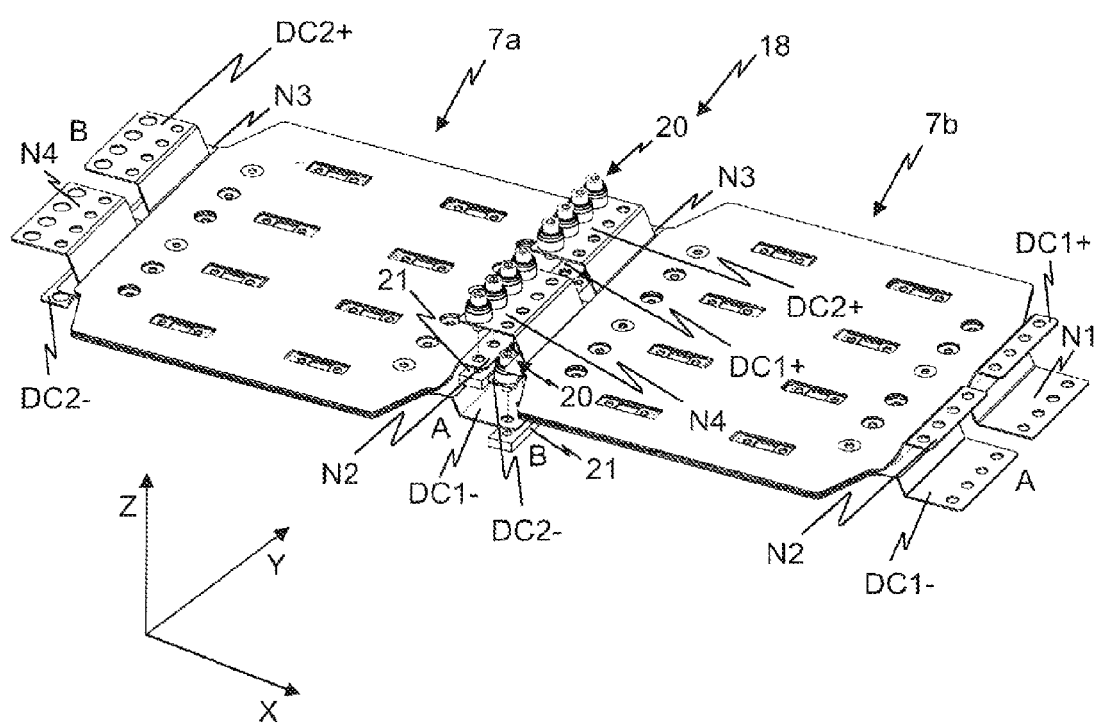
FIG. 8 shows a perspective view of further first and second electrically conducting connection devices, in accordance with the invention.

Alternatively, as represented in FIG. 8 in terms of first and second connection devices 7a and 7b, a plurality of inventive 3-level power converter devices can also be electrically conductively connected directly with one another by means of a screw connection. First direct voltage positive potential terminal DC1+ of first 3-level power converter device 2 has an electrically conducting contact with second direct voltage positive potential terminal DC2+ of second 3-level power converter device 3, and first direct voltage negative potential terminal DC1− of first 3-level power converter device 2 has an electrically conducting contact with second direct voltage negative potential terminal DC2− of second 3-level power converter device 3, and first neutral voltage potential terminal N1 of first 3-level power converter device 2 has an electrically conducting contact with third neutral voltage potential terminal N3 of second 3-level power converter device 3, and second neutral voltage potential terminal N2 of first 3-level power converter device 2 has an electrically conducting contact with fourth neutral voltage potential terminal N4 of second 3-level power converter device 3; in each case these contacts with the respective potential terminals are made by means of a screw connection 20. For this purpose, the potential terminals preferably have, as represented in FIG. 8, through-passage holes, through which screws pass for purposes of implementing the screw connection, wherein the screws are screwed into holes of respectively assigned mating threaded screw elements 21.

Here, in the context of the example of embodiment, second neutral voltage potential terminal N2, first direct voltage positive potential terminal DC1+, second direct voltage negative potential terminal DC2− and third neutral voltage potential terminal N3 have a smaller dimension in the first direction X compared with first direct voltage negative potential terminal DC1−, first neutral voltage potential terminal N1, fourth neutral voltage potential terminal N4 and second direct voltage positive potential terminal DC2+. As an alternative to this arrangement, first direct voltage negative potential terminal DC1−, first neutral voltage potential terminal N1, fourth neutral voltage potential terminal N4 and second direct voltage positive potential terminal DC2+ could also have a smaller dimension in the first direction X compared with second neutral voltage potential terminal N2, first direct voltage positive potential terminal DC1+, second direct voltage negative potential terminal DC2− and third neutral voltage potential terminal N3. This enables a simple arrangement of the potential terminals that are to be screwed together.

In other respects the example of embodiment as per FIG. 8 corresponds to the embodiment of FIG. 5.

The power semiconductor switches in general take the form of transistors, such as, e.g., IGBTs (insulated gate bipolar transistors), or MOSFETs (metal oxide semiconductor field effect transistors), or the form of thyristors that can be switched out in a controlled manner, wherein in the described embodiment the power semiconductor switches are present in the form of IGBTs and the first load current terminal C of the respective power semiconductor switch exists in the form of the collector of the respective IGBT and the second load current terminal E of the respective power semiconductor switch exists in the form of the emitter of the respective IGBT. The control terminal of the power semiconductor switches is present in the example of embodiment in the form of the gate G of the respective IGBT.

It should be noted at this point that the inventive 3-level power converter device can, needless to say, also have a plurality of 3-level half-bridge power converters.

Furthermore it should be noted at this point that in the sense of the present invention the expression that two elements are or will be electrically conductively connected with one another is understood to include both a direct electrically conducting connection of two elements by means of e.g., a welded, soldered or sintered joint, which exists between the two elements, and also an indirect electrically conducting connection, by means e.g., of one or a plurality of electrically conducting line elements, such as e.g., a conductor track, a bond wire, an electrically conducting film composite, a current rail, or cable, which connect the two elements electrically with one another so that a bidirectional electrical current flow is possible between the two elements electrically conductively connected with one another.

Furthermore it should be noted that in the sense of the present invention the more general expression potential terminal is understood to include a direct voltage positive potential terminal, a direct voltage negative potential terminal or a neutral voltage potential terminal.

In the preceding Detailed Description, reference was made to the accompanying drawings, which form a part of his disclosure, and in which are shown illustrative specific embodiments of the invention. In this regard, directional terminology, such as "top", "bottom", "left", "right", "front", "back", etc., is used with reference to the orientation of the Figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A 3-level power converter system, said system comprising first and second 3-level power converter devices each of which 3-level power converter devices comprises:
   a first face;
   a first direct voltage positive potential terminal;
   a first direct voltage negative potential terminal; and
   first and second neutral voltage potential terminals, said first and second neutral voltage potential terminals being electrically conductively connected to one another;
   wherein each of said first direct voltage positive potential terminal, said first direct voltage negative potential terminal, and said first and second neutral voltage potential terminals is flat;
      is disposed on said first face of said 3-level power converter device; and
      protrudes from said first face of said 3-level power converter device in a first direction;
   wherein said first direct voltage positive potential terminal and said first neutral voltage potential terminal together form a first terminal pair, and said second neutral voltage potential terminal and said first direct voltage negative potential terminal together form a second terminal pair;
   wherein said first and second terminal pairs are disposed one behind another in a second direction generally perpendicular to said first direction; and
   wherein said first direct voltage positive potential terminal and said first neutral voltage potential terminal are disposed one above another in a third direction generally perpendicular to both said first and second directions, and said second neutral voltage potential terminal and said first direct voltage negative potential terminal are disposed one above another in said third direction;
   a second face opposite said first face;
   a second direct voltage positive potential terminal;
   a second direct voltage negative potential terminal; and
   third and fourth neutral voltage potential terminals;
   wherein each of said second direct voltage positive potential terminal, said second direct voltage negative potential terminal, and said third and fourth neutral voltage potential terminals is flat;
      is disposed on said second face of said 3-level power converter device; and
      intrudes into said 3-level power converter device in said first direction;
   wherein said first, second, third and fourth neutral voltage potential terminals are electrically conductively connected with one another;
   wherein said first and second direct voltage positive potential terminals are electrically conductively connected with one another;
   wherein said first and second direct voltage negative potential terminals are electrically conductively connected with one another;
   wherein said second direct voltage positive potential terminal and said third neutral voltage potential terminal together form a third terminal pair, and said fourth neutral voltage potential terminal and said second direct voltage negative potential terminal together form a fourth terminal pair;
   wherein said third and fourth terminal pairs are disposed one behind another in said second direction; and
   wherein said second direct voltage positive potential terminal and said third neutral voltage potential terminal are disposed one above another in said third direction, and said fourth neutral voltage potential terminal and said second direct voltage negative potential terminal are disposed one above another in said third direction;
   said first direct voltage negative potential terminal of said first 3-level power converter device is electrically conductively connected with said second direct voltage positive potential terminal of said second 3-level power converter device;
   said first direct voltage negative potential terminal of said first 3-level power converter device is electrically conductively connected with said second direct voltage negative potential terminal of said second 3-level power converter device;
   said first neutral voltage potential terminal of said first 3-level power converter device is electrically conductively connected with said third neutral voltage potential terminal of said second 3-level power converter device; and
   said second neutral voltage potential terminal of said first 3-level power converter device is electrically conductively connected with said fourth neutral voltage potential terminal of said second 3-level power converter device.

2. The 3-level power converter system of claim 1, wherein said first direct voltage positive potential terminal of said first 3-level power converter device has an electrically conducting contact with said second direct voltage positive potential terminal of said second 3-level power converter device;
   said first direct voltage negative potential terminal of said first 3-level power converter device has an electrically conducting contact with said second direct voltage negative potential terminal of said second 3-level power converter device;
   said first neutral voltage potential terminal of said first 3-level power converter device has an electrically conducting contact with said third neutral voltage potential terminal of said second 3-level power converter device; and
   said second neutral voltage potential terminal of said first 3-level power converter device has an electrically conducting contact with said fourth neutral voltage potential terminal of said second 3-level power converter device;
   wherein each electrically conducting contact is a screw connection.

3. The 3-level power converter system of claim 1, wherein said first direct voltage negative potential terminal of said first 3-level power converter device is connected via an electrically conductive clamp with said second direct voltage positive potential terminal of said second 3-level power converter device;
   said first direct voltage negative potential terminal of said first 3-level power converter device is connected via an electrically conductive clamp with said second direct voltage negative potential terminal of said second 3-level power converter device;
   said first neutral voltage potential terminal of said first 3-level power converter device is connected via an electrically conductive clamp with said third neutral voltage potential terminal of said second 3-level power converter device; and
   said second neutral voltage potential terminal of said first 3-level power converter device is connected via an electrically conductive clamp with said fourth neutral voltage potential terminal of said second 3-level power converter device.

4. The 3-level power converter system of claim 3, wherein at least one of said electrically conductive clamps has a first electrically conducting clamp element and a second magnetically non-conducting clamp element, between which said respective potential terminals are disposed, connected with one another via said respective clamp.

\* \* \* \* \*